(12) United States Patent
Fukasawa et al.

(10) Patent No.: US 9,721,876 B2
(45) Date of Patent: Aug. 1, 2017

(54) SEMICONDUCTOR DEVICE AND METHOD OF MAKING THE SAME

(71) Applicant: SHINKO ELECTRIC INDUSTRIES CO., LTD., Nagano (JP)

(72) Inventors: Ryo Fukasawa, Nagano (JP); Michio Horiuchi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 28 days.

(21) Appl. No.: 14/946,953

(22) Filed: Nov. 20, 2015

(65) Prior Publication Data

US 2016/0181190 A1 Jun. 23, 2016

(30) Foreign Application Priority Data

Dec. 17, 2014 (JP) ................. 2014-254997

(51) Int. Cl.
*H01L 23/48* (2006.01)
*H01L 23/495* (2006.01)
*H01L 21/56* (2006.01)
*H01L 23/433* (2006.01)
*H01L 23/31* (2006.01)

(52) U.S. Cl.
CPC ...... *H01L 23/49575* (2013.01); *H01L 21/563* (2013.01); *H01L 23/3107* (2013.01); *H01L 23/4334* (2013.01); *H01L 23/49503* (2013.01); *H01L 23/49513* (2013.01); *H01L 2224/73204* (2013.01); *H01L 2924/0002* (2013.01); *H01L 2924/181* (2013.01)

(58) Field of Classification Search
CPC .......... H01L 23/49827; H01L 23/4983; H01L 23/49894
See application file for complete search history.

(56) References Cited

U.S. PATENT DOCUMENTS

2006/0091516 A1* 5/2006 Matsunami ........... H01L 21/565
257/686
2006/0180904 A1* 8/2006 Ong .................... H01L 23/3107
257/676

(Continued)

FOREIGN PATENT DOCUMENTS

JP 2001/015644 * 1/2001
JP 2008-141061 6/2008

*Primary Examiner* — A. Sefer
(74) *Attorney, Agent, or Firm* — IPUSA, PLLC

(57) ABSTRACT

A semiconductor device includes a first electronic component mounted to an upper face of a plated interconnect layer, a second electronic component mounted to a lower face of the plated interconnect layer, a first resin part covering the first electronic component on an upper side of the plated interconnect layer, and a second resin part covering the second electronic component on a lower side of the plated interconnect layer, wherein the first and second electronic components at least partially face each other across the plated interconnect layer, wherein the plated interconnect layer includes a sloping portion disposed on a sloping boundary between the first and second resin parts, and wherein an end part of the sloping portion is bent to have a face thereof exposed from the second resin part, and a lower surface of the second resin part is flush with the face of the end part.

6 Claims, 13 Drawing Sheets

(56) References Cited

U.S. PATENT DOCUMENTS

2007/0259482 A1* 11/2007 Tsai .................. H01L 23/49575
  438/109
2008/0128916 A1   6/2008 Soejima et al.
2012/0139122 A1* 6/2012 Honjo ..................... H01L 25/16
  257/773

* cited by examiner

SEMICONDUCTOR DEVICE AND METHOD OF MAKING THE SAME

CROSS-REFERENCE TO RELATED APPLICATIONS

The present application is based upon and claims the benefit of priority from the prior Japanese Patent Application No. 2014-254997 filed on Dec. 17, 2014, with the Japanese Patent Office, the entire contents of which are incorporated herein by reference.

FIELD

The disclosures herein relate to a semiconductor device and a method of making a semiconductor device.

BACKGROUND

In recent years, multichip packaging has been predominantly used in the field of semiconductor device packaging. Along with this trend, development efforts have been directed to 2.5-D packaging technology utilizing silicon interposers, silicon bridges, fine resin interposers or the like as well as 3-D packaging technology utilizing silicon interposers or glass interposers.

2.5-D packaging, however, connects chips with each other through planar interconnections, which results in the need to lay out a large number of interconnections within a limited area. Formation of fine interconnections may be needed for such purposes, which may result in a complex structure and complicated manufacturing steps. Lengthy interconnections having short intervals connect between chips. Such an arrangement may cause interference and the like between signal lines, thereby creating an adverse effect on the transmission characteristics.

3-D packaging technology provides penetrating electrodes through silicon interposers and glass interposers to achieve the shortest-distance connections between chips. Forming penetrating electrodes, however, involves high cost, which hinders the spread of their use. Further, silicon interposers use semiconductor for the base substrate thereof, thereby causing parasitic LCR to be created between interconnection patterns and the substrate. This causes degradation in high-speed signal characteristics. The use of glass interposers serves to avoid the effect of parasitic impedances, but forming penetrating electrodes at narrow pitches through glass interposers is more difficult than in the case of silicon interposers. There is also the problem of higher thermal resistance.

There is a 3-D packaging technology that mounts a chip on an interconnection layer formed on a silicon support base, and removes the support base, followed by using the interconnection layer for connections with chips on both faces thereof. This technology does not involve the formation of penetrating electrodes, and utilizes the vias of the interconnection layer to connect between the chips. With this arrangement, thus, the problem of high process cost for providing penetrating electrodes through silicon interposers and glass interposers do not exist.

The above-noted technology uses silicon as the support base, and the removal of such a support base complicates the production steps.

Accordingly, it may be desirable to provide a semiconductor device that has a plurality electronic components arranged in the thickness direction thereof, and that is produced by simple production steps.

[Patent Document 1] Japanese Laid-open Patent Publication No. 2008-141061

SUMMARY

A semiconductor device includes a single-layered plated interconnect layer, a first electronic component mounted to an upper face of the plated interconnect layer, a second electronic component mounted to a lower face of the plated interconnect layer, a first resin part covering the first electronic component and situated on an upper side of the plated interconnect layer, and a second resin part covering the second electronic component and situated on a lower side of the plated interconnect layer, wherein at least one of the first electronic component and the second electronic component is a semiconductor chip, and at least part of the first electronic component and at least part of the second electronic component face each other across the plated interconnect layer, wherein the plated interconnect layer includes a sloping portion disposed on a sloping boundary between the first resin part and the second resin part, the sloping portion sloping downward toward a periphery of the plated interconnect layer, and wherein an end part of the sloping portion is bent to have a face of the end part exposed from the second resin part, and a lower surface of the second resin part is flush with the face of the end part.

A method of making a semiconductor device includes processing a metal plate to form a first recess therein, to form a plurality of second recesses in a bottom surface of the first recess, and to form a circumferential recess at a perimeter of a bottom surface of each of the second recesses, forming a single-layered plated interconnect layer extending from the bottom surface of each of the second recesses to a bottom surface of the circumferential recess, mounting a first electronic component to an upper face of the plated interconnect layer at a position of the bottom surface of the second recess, forming a first resin part covering the first electronic component and situated on an upper side of the plated interconnect layer, the first resin part filling the first recess including the second recesses, removing the metal plate to form third recesses at a lower surface of the first resin part so as to expose a lower face of the plated interconnect layer in the third recesses, mounting a second electronic component to the lower face of the plated interconnect layer in each of the third recesses, and forming a second resin part covering the second electronic component and situated on a lower side of the plated interconnect layer, the second resin part filling each of the third recesses, wherein at least one of the first electronic component and the second electronic component is a semiconductor chip, and at least part of the first electronic component and at least part of the second electronic component face each other across the plated interconnect layer, wherein the plated interconnect layer includes a sloping portion sloping downward toward a periphery of the plated interconnect layer, wherein an end part of the sloping portion is bent to have a face of the end part exposed from the first resin part and the second resin part.

Other objects and further features of the present invention will be apparent from the following detailed description when read in conjunction with the accompanying drawings.

DESCRIPTION OF EMBODIMENTS

In the following, embodiments will be described by referring to the accompanying drawings. In these drawings, the same elements are referred to by the same references, and a duplicate description thereof may be omitted.

First Embodiment

Structure of Semiconductor Device of First Embodiment

Figure 1A:
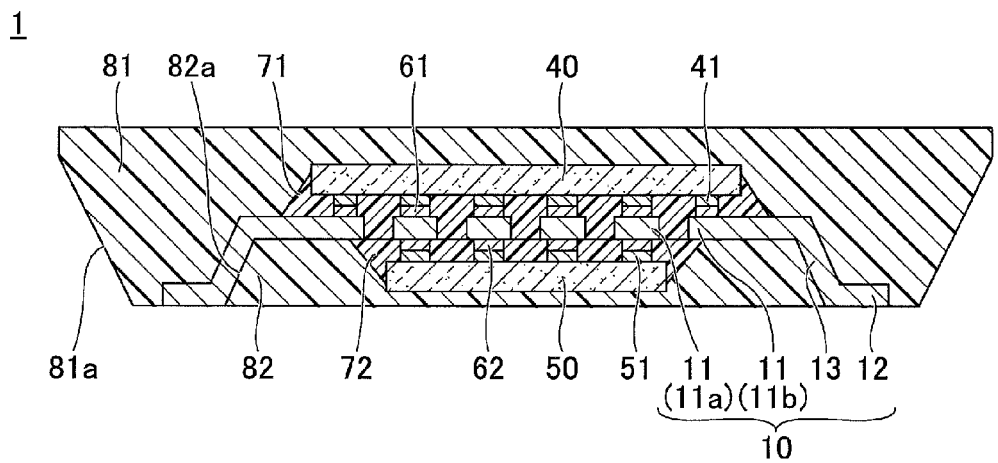
FIGS. 1A and 1B are drawings illustrating an example of a semiconductor device according to a first embodiment.
Figure 1B:
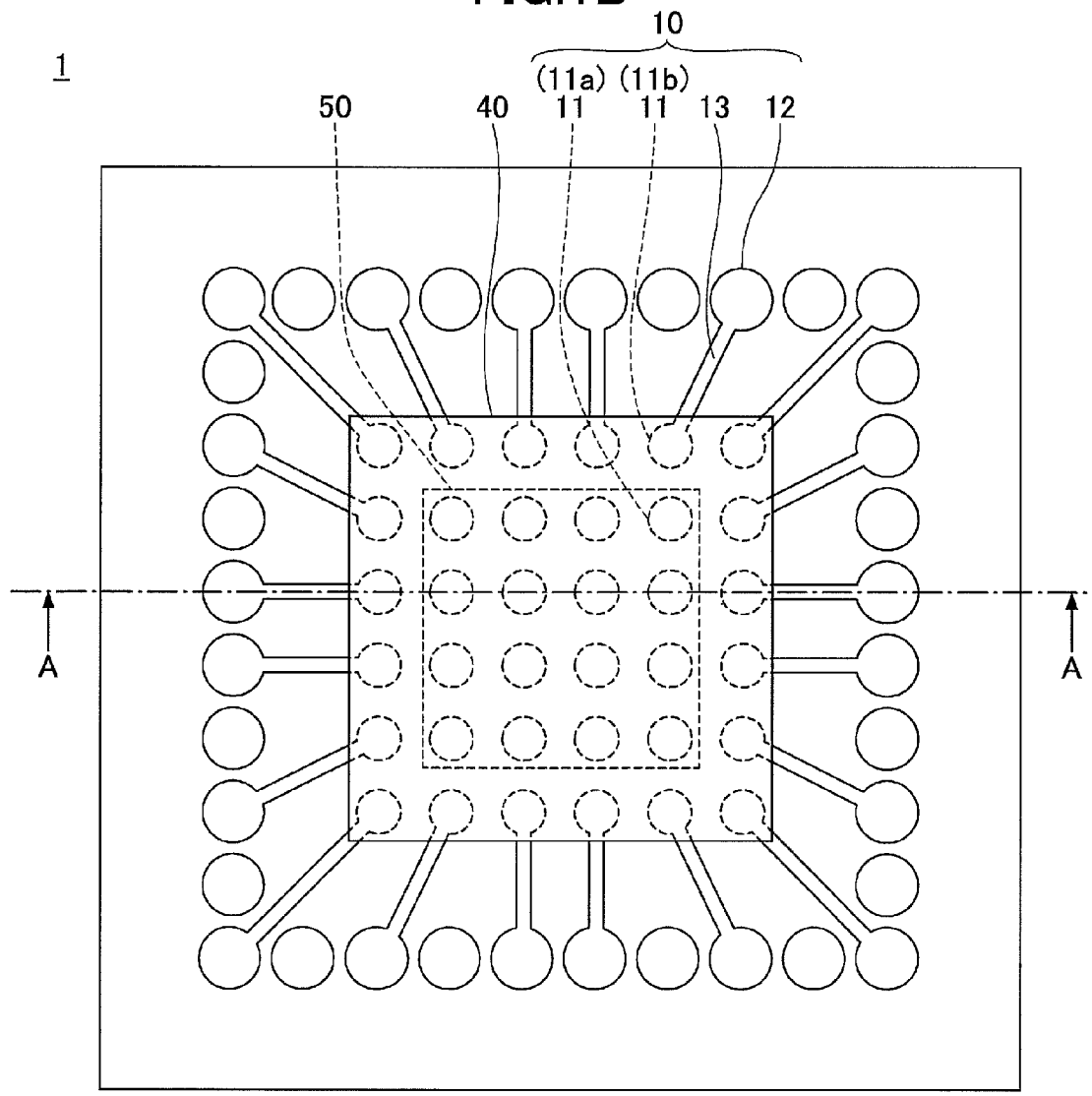

In the following, a description will be first given of the structure of a semiconductor device of a first embodiment. FIGS. 1A and 1B are drawings providing illustrations of an example of the semiconductor device according to the first embodiment. FIG. 1B illustrates a plan view, and FIG. 1A illustrates a cross-sectional view taken along a line A-A in FIG. 1B. It may be noted that in FIG. 1B, a first resin part 81 is omitted from the illustration (only the outline is illustrated). Further, only some representative ones of interconnections 13 are illustrated.

In FIGS. 1A and 1B, a semiconductor device 1 of the first embodiment is a multichip package semiconductor device, and includes a plated interconnect layer 10, semiconductor chips 40 and 50, joint parts 61 and 62, underfill resins 71 and 72, a first resin part 81 and a second resin part 82.

In the present embodiment, for the sake of convenience, the side toward which the semiconductor chip 40 of the semiconductor device 1 faces is referred to as an upper side or a first side, and the side toward which the semiconductor chip 50 faces is referred to as a lower side or a second side. A surface (or face) of a given member that faces toward the upper side is referred to as a first surface (or first face) or an upper surface (or upper face), and a surface (or face) of the given member that faces toward the lower side is referred to as a second surface (or second face) or a lower surface (or lower face). It may be noted, however, that the semiconductor device 1 may be used in an upside-down position, or may be placed at any angle. Further, a plan view refers to a view taken in the direction perpendicular to the first surface of the semiconductor chip 40, and a planar shape refers to the shape of an object as viewed in the direction perpendicular to the first surface of the semiconductor chip 40.

The semiconductor device 1 has a generally rectangular planar shape. The semiconductor device 1 has the semiconductor chip 40 and the semiconductor chip 50 at a general center thereof in a plan view, which are situated at respective, different positions in the thickness direction thereof. In the following, the individual parts of the semiconductor device 1 will be described.

The plated interconnect layer 10 may be a single-layered layer including pads 11(11a, 11b), external connection terminals 12, and interconnections 13. The thickness of the plated interconnect layer 10 may approximately be greater than or equal to 1 micrometer and smaller than or equal to 35 micrometers, for example. Cu may be used as the material of the plated interconnect layer 10. The plated interconnect layer 10 may have a structure in which a plurality of metal layers are laminated. For example, the plated interconnect layer 10 may have a structure in which a nickel (Ni) layer, a palladium (Pd) layer, and a gold (Au) layer are laminated in this order on the surface of a copper (Cu) layer. In such a case, it suffices for the plated interconnect layer 10 to have at least one of the plurality of metal layers that is formed by plating. For example, a metal layer formed by sputtering may be included.

The pads 11 are coupled with the semiconductor chips 40 and 50. The pads 11 may have a circular planar shape, and are arranged in a two-dimensional array. The external connection terminals 12 serve to couple the semiconductor chips 40 and 50 to an external printed circuit board or the like. The external connection terminals 12 may have a circular planar shape, and are arranged all around and outside the area where the pads 11 are arranged.

The lower surfaces of the external connection terminals 12 are exposed from the lower surface of the semiconductor device 1. The lower surfaces of the external connection terminals 12 and the lower surface of the semiconductor device 1 (i.e., the lower surfaces of the first resin part 81 and the second resin part 82) may be configured to be flush with each other, for example. The pads 11 (11a, 11b) and the external connection terminals 12 are situated at respective, different positions in the thickness direction of the semiconductor device 1, and the pads 11b are electrically coupled with the external connection terminals 12 through the interconnections 13 that are formed as three-dimensional structures.

In other words, the plated interconnect layer 10 includes the interconnections 13 that have sloping portions extending from the upper side to the lower side. Each of the sloping portions has an end thereof bent to form a corresponding one of the external connection terminals 12. The lower surfaces of the external connection terminals 12 are exposed from the first resin part 81 and the second resin part 82. The sloping portions of the interconnections 13 may be formed along the sloping faces (i.e., tapering portions 82a which will be described later) of the second resin part 82.

Figure 2:
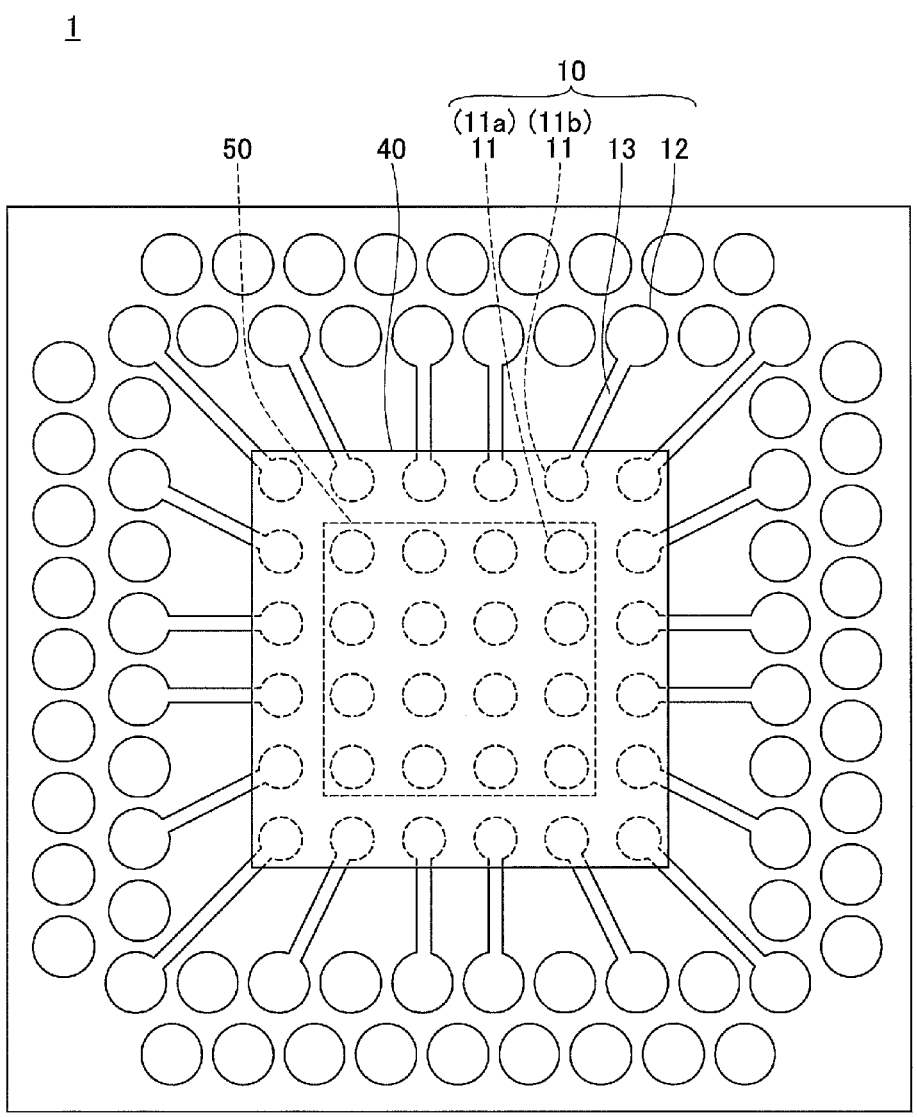
FIG. 2 is a drawing illustrating another example of the arrangement of external connection terminals.

An example illustrated in FIG. 1B in which the external connection terminals 12 are arranged in one line is not a limiting example, and the external connection terminals 12 may be arranged in two or more rows as illustrated in FIG. 2 (i.e., two rows in this example).

The line width and space of the interconnections 13 may range approximately from 10 micrometers and 10 micrometers, respectively, to 100 micrometers and 100 micrometers, respectively. The term "line width" in the phrase "line width and space" refers to the width of the interconnections 13, and the term "space" refers to the gap (i.e., interval) between the immediately adjacent interconnections. The statement that the line width and space are 10 micrometers and 10 micrometers, respectively, means that the width of the interconnections is 10 micrometers, and, also, that the interval between the immediately adjacent interconnections is 10 micrometers.

The semiconductor chip 40 may include a semiconductor integrated circuit formed with silicon and the like, and has pads 41 formed on the lower surface thereof. The semiconductor chip 40 is mounted to the first faces of the pads 11 that are part of the plated interconnect layer 10. The lower surfaces of the pads 41 of the semiconductor chip 40 and the upper surfaces of the pads 11 of the plated interconnect layer 10 are electrically connected with each other through the joint parts 61. The thickness of the semiconductor chip 40 may approximately be 50 micrometers, for example. The semiconductor chip 40 is a representative example of a first electronic component used in the technology of this disclosure.

The semiconductor chip 50 may include a semiconductor integrated circuit formed with silicon and the like, and has pads 51 formed on the upper surface thereof. The semiconductor chip 50 is mounted to the second faces of the pads 11 that are part of the plated interconnect layer 10. The upper surfaces of the pads 51 of the semiconductor chip 50 and the lower surfaces of the pads 11 of the plated interconnect layer 10 are electrically connected with each other through the joint parts 62. The thickness of the semiconductor chip 50 may approximately be 50 micrometers, for example. The semiconductor chip 50 is a representative example of a second electronic component used in the technology of this disclosure.

In the example illustrated in FIGS. 1A and 1B, the semiconductor chip 40 and the semiconductor chip 50 entirely overlap each other across the plated interconnect layer 10. This structure is not a limiting example. Namely, it suffices for the semiconductor chip 40 and the semiconductor chip 50 to overlap at least part of each other across the plated interconnect layer 10. Such a structure ensures that the size of the semiconductor device 1 in a plan view is made small.

The semiconductor chip 40 and the semiconductor chip 50 may have the same functions or may have different functions. In the present embodiment, the semiconductor chip 40 may be larger than the semiconductor chip 50 in a plan view. The semiconductor chip 40 and the semiconductor chip 50 may have the same planar shape. Alternatively, the semiconductor chip 50 may be larger than the semiconductor chip 40.

The joint parts 61 and 62 may be solder bumps, for example. An alloy including Pb, an alloy of Sn and Cu, an alloy of Sn and Ag, or an alloy of Sn, Ag, and Cu may be used as a material to form the solder bumps. The joint parts 61 and the joint parts 62 may be made of respective, different materials.

A method of jointing the plated interconnect layer 10 with the semiconductor chip 40 and the semiconductor chip 50 may not be limited to the use of the joint parts 61 and 62 such as solder bumps, and may be the use of Cu—Cu direct bonding based on surface activation treatment.

The underfill resin 71 is disposed between the semiconductor chip 40 and the plated interconnect layer 10 to cover the joint parts 61. The underfill resin 72 is disposed between the semiconductor chip 50 and the plated interconnect layer 10 to cover the joint parts 62. The underfill resins 71 and 72 may be made of an epoxy-based resin or the like that has sufficient fluidity.

The first resin part 81 covers the semiconductor chip 40 and the underfill resin 71 on the upper side of the plated interconnect layer 10. The lateral faces of the first resin part 81 have tapered portions 81a situated toward the lower side, such that the tapered portions 81a have a transverse length thereof decreasing from the upper side to the lower side. The second resin part 82 covers the semiconductor chip 50 and the underfill resin 72 on the lower side of the plated interconnect layer 10. The lateral faces of the second resin part 82 form tapered portions 82a that have a transverse length thereof increasing from the upper side to the lower side.

Faces that face each other across the boundaries between the first resin part 81 and the second resin part 82 include sloping surfaces, on which the sloping portions of the interconnections 13 are situated. The material of the first resin part 81 and the second resin part 82 may be an epoxy-based resin or the like that has sufficient rigidity through inclusion of fillers, for example. In some cases, the first resin part 81 and the second resin part 82 may be collectively referred to as a resin part or resin parts.

Method of Making Semiconductor Device of First Embodiment

In the following, a description will be given of a method of making a semiconductor device according to the first embodiment. FIGS. 3A and 3B through FIGS. 5A to 5C are drawings illustrating examples of process steps for making a semiconductor device according to the first embodiment.

Figure 3A:
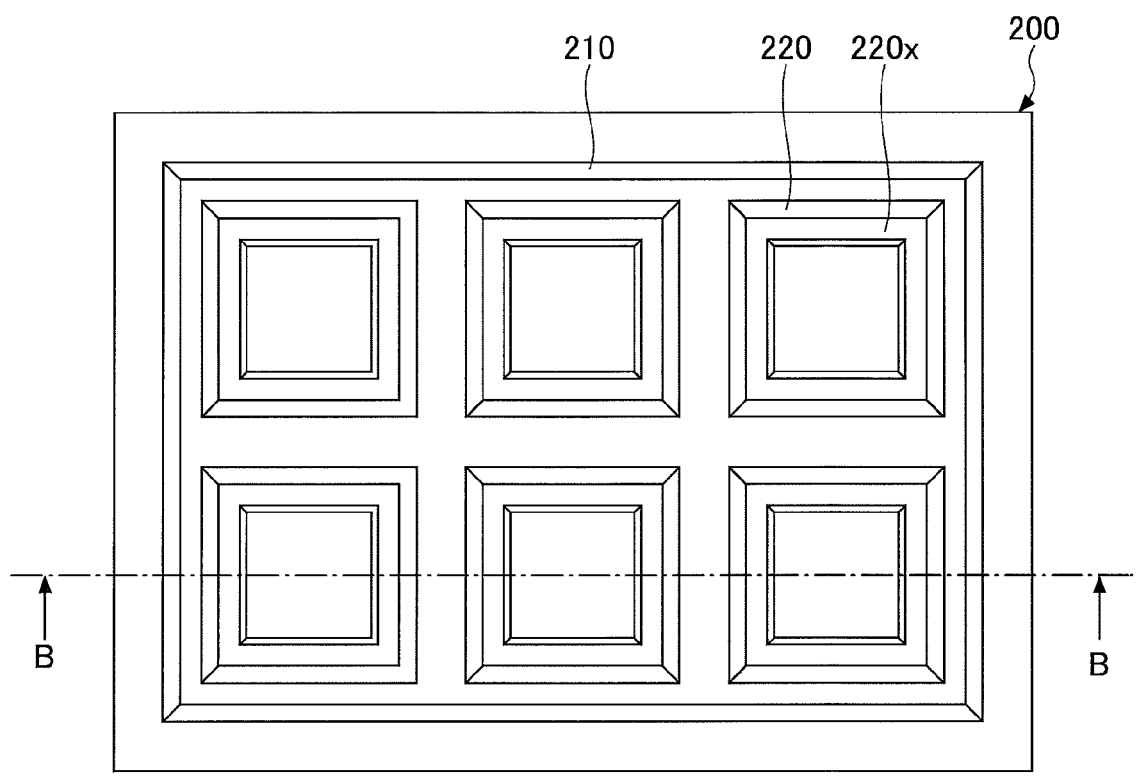
FIGS. 3A and 3B are drawings illustrating an example of process steps for making a semiconductor device according to the first embodiment.
Figure 3B:
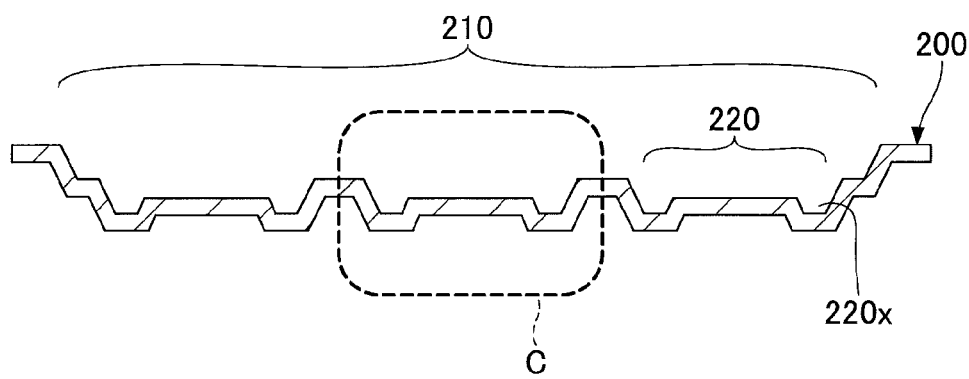

In the process steps illustrated in FIGS. 3A and 3B, a generally rectangular planar metal plate 200 is prepared. Aluminum (Al), copper (Cu), 42 alloy or the like may be used as the material of the metal plate 200. The thickness of the metal plate 200 may approximately be 0.1 to 1 millimeters, for example. The metal plate 200 is pressed to form a first recess 210 and second recesses 220.

42 alloy has a thermal expansion coefficient that is close to that of silicon constituting the semiconductor chip 40. Use of 42 alloy as the material of the metal plate 200 serves to reduce a distortion of the plated interconnect layer 10 that is caused by a difference in the thermal expansion coefficient between the semiconductor chip 40 and the metal plate 200 in the step of mounting the semiconductor chip 40 and the step of forming the first resin part 81, which will be described later.

The first recess 210 is formed in the area excluding the frame-shaped perimeter of the metal plate 200. The inner side faces of the first recess 210 are sloping such that the distance across the recess increases toward the upper side. The second recesses 220 (six second recesses in the example illustrated in FIG. 3A) are formed in the bottom surface of the first recess 210. The inner side faces of each of the second recesses 220 are sloping such that the distance across the recess increases toward the upper side. A frame-shaped recess 220x is formed in the bottom surface of each of the second recesses 220 along the perimeter thereof such as to have a surface lower than the center of the bottom surface of each of the second recesses 220.

FIG. 3A is a plan view, and FIG. 3B is a cross-sectional view taken along the line B-B in FIG. 3A. Subsequent process steps will be described with reference to a cross-sectional view of a part C (i.e., a single second recess 220) illustrated in FIG. 3B. It may be noted, however, that the same process steps are performed with respect to the remaining second recesses 220.

Figure 4A:
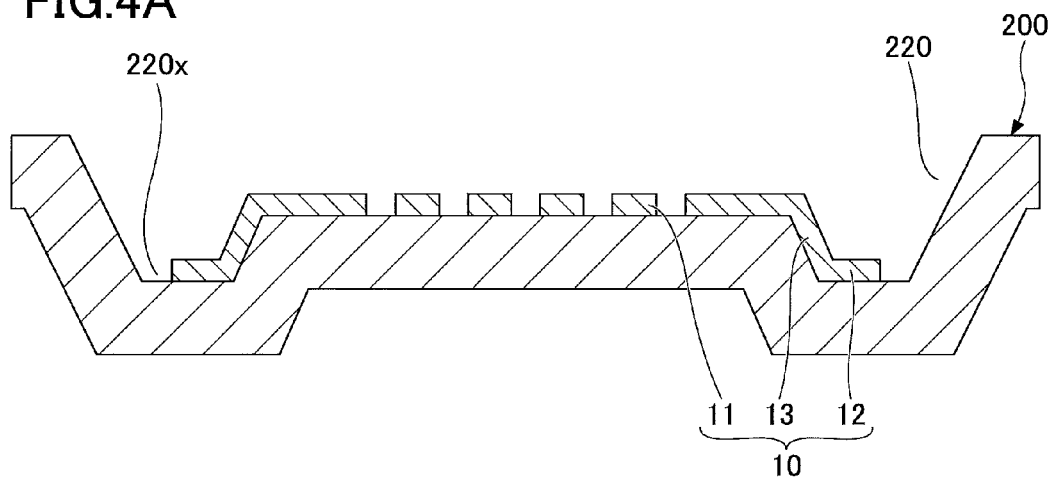
FIGS. 4A through 4C are drawings illustrating an example of process steps for making the semiconductor device according to the first embodiment.

In the process step illustrated in FIG. 4A, a single-layered plated interconnect layer 10 that extends from the bottom surface of the second recess 220 to the bottom surface of the frame-shaped recess 220x is formed in the second recess 220. The plated interconnect layer 10 includes the pads 11, the external connection terminals 12, and the interconnections 13. Specifically, a resist pattern having openings corresponding to the plated interconnect layer 10 is first formed. The plated interconnect layer 10 made of copper (Cu) or the like is formed in the openings of the resist pattern by electrolytic plating or the like utilizing the metal plate 200 as a power feed layer, followed by removing the resist pattern.

Figure 4B:
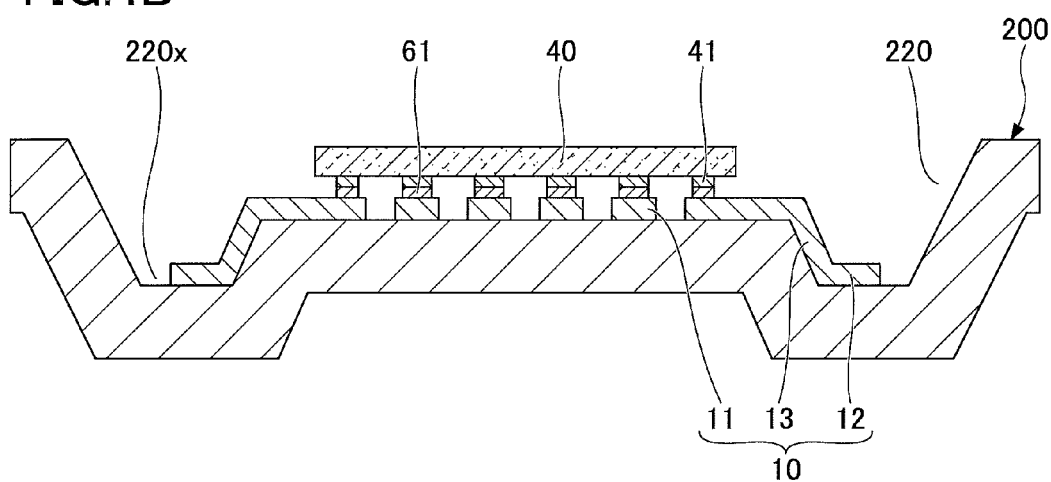

In the process step illustrated in FIG. 4B, the semiconductor chip 40 is mounted through the joint parts 61 to the first face of the plated interconnect layer 10 (i.e., pads 11) formed on the bottom surface of the second recess 220. Specifically, the joint parts 61 of paste solder material or the like are formed on the upper surface of the pads 11, and the pads 41 of the semiconductor chip 40 are disposed to face the pads 11 through the joint parts 61. The joint parts 61 are then melted and solidified to electrically connect the pads 41 of the semiconductor chip 40 with the pads 11 through the joint parts 61.

Figure 4C:
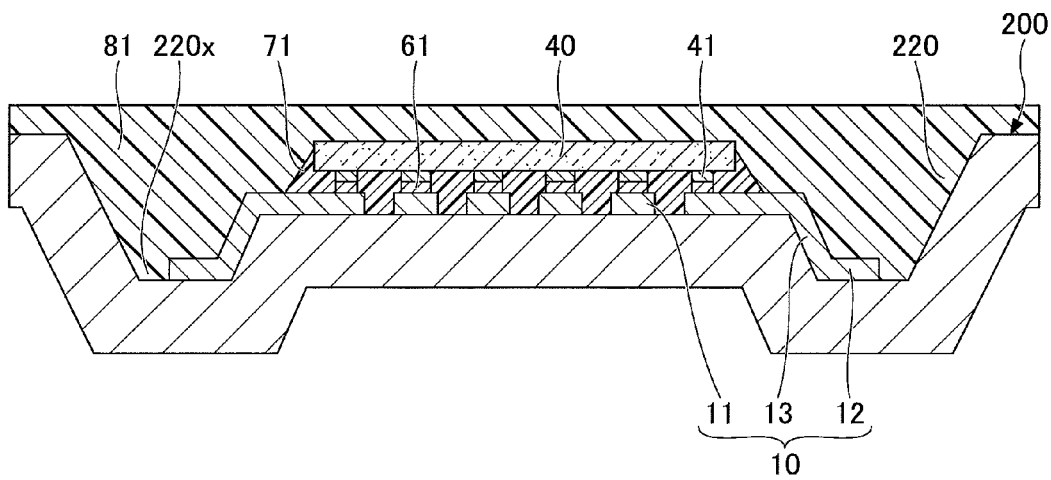

In the process step illustrated in FIG. 4C, the underfill resin 71 for covering the joint parts 61 is disposed between the semiconductor chip 40 and the plated interconnect layer 10, followed by forming the first resin part 81 that fills the second recess 220 and that has an upper face reaching the inner side faces of the first recess 210. Namely, the first resin part 81 fills the entirety of the second recess 220 and also fills all or part of the first recess 210. With this arrangement, the first resin part 81 covers the semiconductor chip 40 and the underfill resin 71 on the upper side of the plated interconnect layer 10. The first resin part 81 may be made of an epoxy-based resin or the like including fillers, and may be formed by use of a transfer mold method, a compression mold method or the like. In so doing, the first recess 210 and the second recess 220 serve as a mold cast, enabling easy formation of the first resin part 81.

Figure 5A:
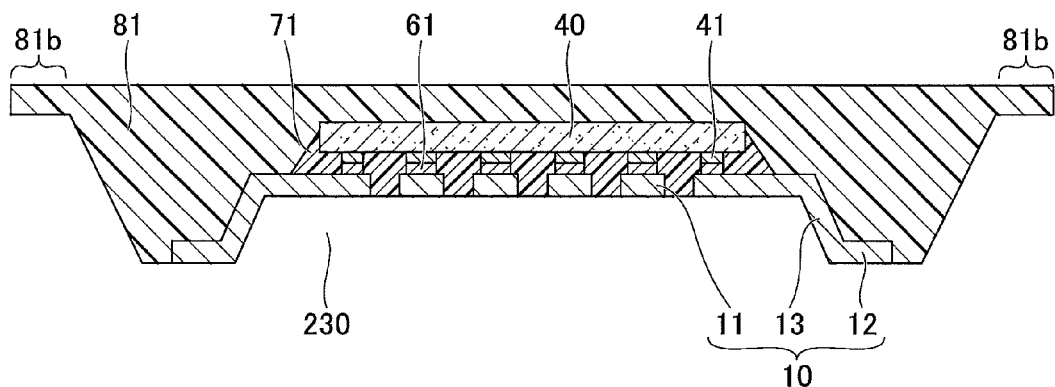
FIGS. 5A through 5C are drawings illustrating an example of process steps for making the semiconductor device according to the first embodiment.

In the process step illustrated in FIG. 5A, the metal plate 200 is removed. In the case of the metal plate 200 being made of aluminum and the plated interconnect layer 10 being made of copper, for example, wet etching that uses hydrochloric acid, aqueous sodium hydroxide or the like may be performed, thereby selectively removing only the metal plate 200 without removing the plated interconnect layer 10. The removal of the metal plate 200 results in a third recess 230 being formed, which is situated on the lower side of the first resin part 81. The second surface of the plated interconnect layer 10 is exposed in the third recess 230. The inner walls of the third recess 230 are formed of the first resin part 81, the plated interconnect layer 10 and the underfill resin 71.

In the process step illustrated in FIG. 4C, the first resin part 81 is formed such that the upper surface thereof reaches the inner side faces of the first recess 210. Because of this, even after the removal of the metal plate 200, the first resin parts 81 existing in the respective second recesses 220 adjacent to each other are connected together through connecting parts 81b. Even in the absence of the metal plate 200, therefore, the subsequent process steps are performed with ease.

Figure 5B:
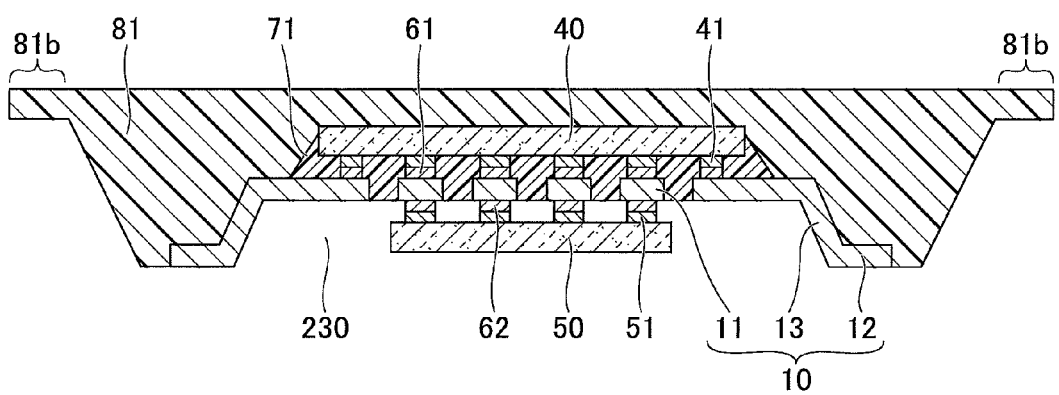

In the process step illustrated in FIG. 5B, the semiconductor chip 50 is mounted to the second face of the plated interconnect layer 10 (i.e., pads 11) through the joint parts 62. Specifically, the joint parts 62 of paste solder material or the like are formed on the lower surface of the pads 11, and the pads 51 of the semiconductor chip 50 are disposed to face the pads 11 through the joint parts 62. The joint parts 62 are then melted and solidified to electrically connect the pads 51 of the semiconductor chip 50 with the pads 11 through the joint parts 62.

Figure 5C:
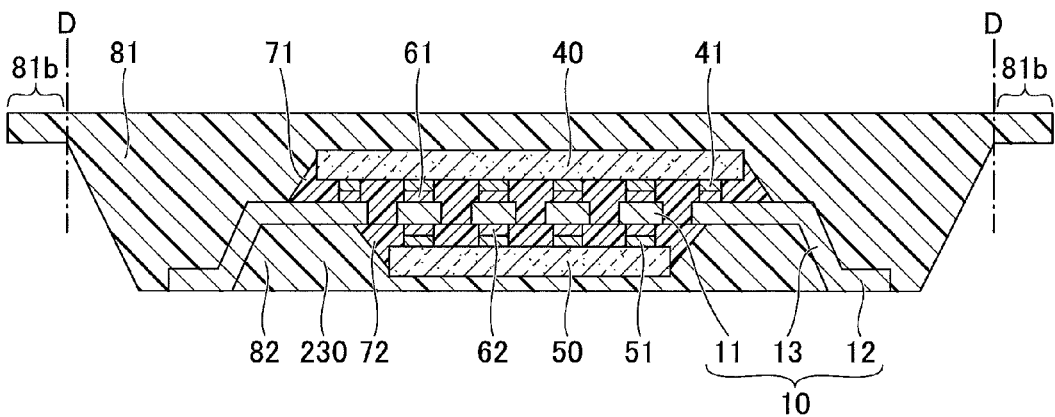

In the process step illustrated in FIG. 5C, the underfill resin 72 for covering the joint parts 62 is disposed between the semiconductor chip 50 and the plated interconnect layer 10, followed by forming the second resin part 82 that fills the third recess 230 and covers the semiconductor chip 50 and the underfill resin 72. With this arrangement, the second resin part 82 covers the semiconductor chip 50 and the underfill resin 72 on the lower side of the plated interconnect layer 10. The lower faces of the external connection terminals 12 of the plated interconnect layer 10 are exposed from the first resin part 81 and the second resin part 82. The lower surface of the second resin part 82 may be flush with the lower surface of the first resin part 81 and the lower faces of the external connection terminals 12. The second resin part 82 may be made of an epoxy-based resin or the like including fillers, and may be formed by use of a transfer mold method, a compression mold method or the like. In so doing, the third recess 230 serves as a mold cast, thereby enabling easy formation of the second resin part 82.

After the process step illustrated in FIG. 5C, the structure illustrated in FIG. 5C is cut at the positions indicated by chain lines D to remove the connecting parts 81b, resulting in a plurality of semiconductor devices 1 of FIG. 1 being produced. It may be noted that a process step of making solder balls or the like on the lower faces of the external connection terminals 12 may be performed after the process step illustrated in FIG. 5A.

Further, the process step illustrated in FIGS. 3A and 3B may be performed after the process step illustrated in FIG. 4A. Namely, the plated interconnect layer 10 may be formed on the metal plate 200 that has yet to be pressed, and, then, the metal plate 200 having the plated interconnect layer 10 formed thereon may be pressed into the shape illustrated in FIGS. 3A and 3B. In this case, the thickness of the plated interconnect layer 10 may properly be determined to ensure that the plated interconnect layer 10 is not broken or disconnected at the time of press working.

In the first embodiment described above, an inexpensive metal plate 200 made of aluminum or the like is used in the process steps of making the semiconductor device 1. The metal plate 200 made of aluminum or the like is also easy to remove compared with silicon or the like, which serves to simplify the process steps of making the semiconductor device 1. These factors contribute to cost reduction of the semiconductor device 1.

Moreover, the arrangement in which the semiconductor chip 40 and the semiconductor chip 50 face each other across the pads 11 (so as to overlap in a plan view) enables minimum-distance connections between the semiconductor chip 40 and the semiconductor chip 50, thereby ensuring improved electrical characteristics of the semiconductor device 1.

The arrangement in which the semiconductor chip 40 and the semiconductor chip 50 face each other across the pads 11 also enables the provision of the semiconductor device 1 that is approximately at most as thick as the combined thickness of the semiconductor chip 40 and the semiconductor chip 50. For example, when the semiconductor chips 40 and 50 each have a thickness of 50 micrometers more or less, the total thickness of the semiconductor device 1 may be limited approximately to 200 micrometers or less.

First Variation of First Embodiment

A first variation of the first embodiment is directed to a configuration in which a seed layer or the like is formed on the metal plate 200. In connection with the first variation of the first embodiment, a description of the same or similar constituent elements as those of the previously provided descriptions may be omitted as appropriate.

FIGS. 6A through 6C and FIGS. 7A through 7C are drawings illustrating examples of process steps of making a semiconductor device according to the first variation of the first embodiment.

The process step of the first embodiment illustrated in FIGS. 3A and 3B is performed first. Thereafter, in the process step illustrated in FIG. 6A, a seed layer 19 that extends from the bottom surface of the second recess 220 to the bottom surface of the frame-shaped recess 220x is formed in the second recess 220. The seed layer 19 may be made of copper (Cu) or the like and formed by sputtering or the like. A barrier layer may also be formed under the seed layer 19. The barrier layer may be made of titanium (Ti), titanium nitride (TiN) or the like and formed by sputtering or the like.

Figure 6A:
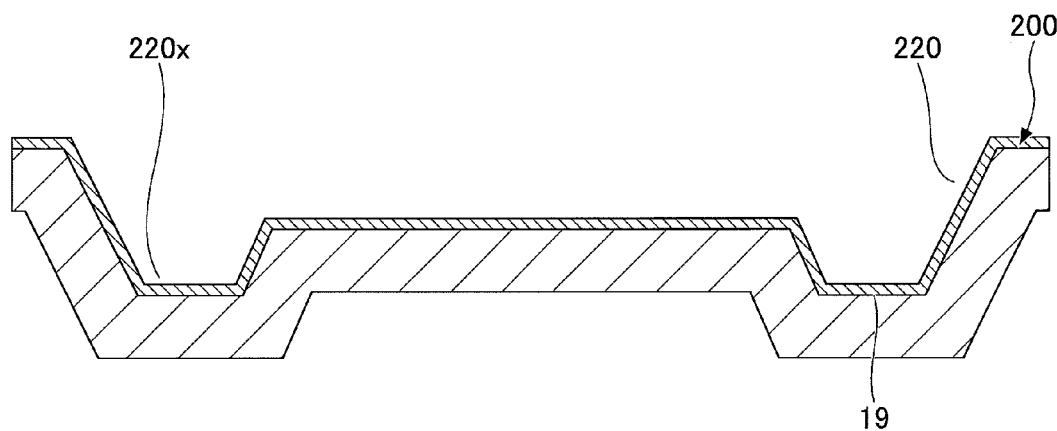
FIGS. 6A through 6C are drawings illustrating an example of process steps for making the semiconductor device according to a first variation of the first embodiment.
Figure 6B:
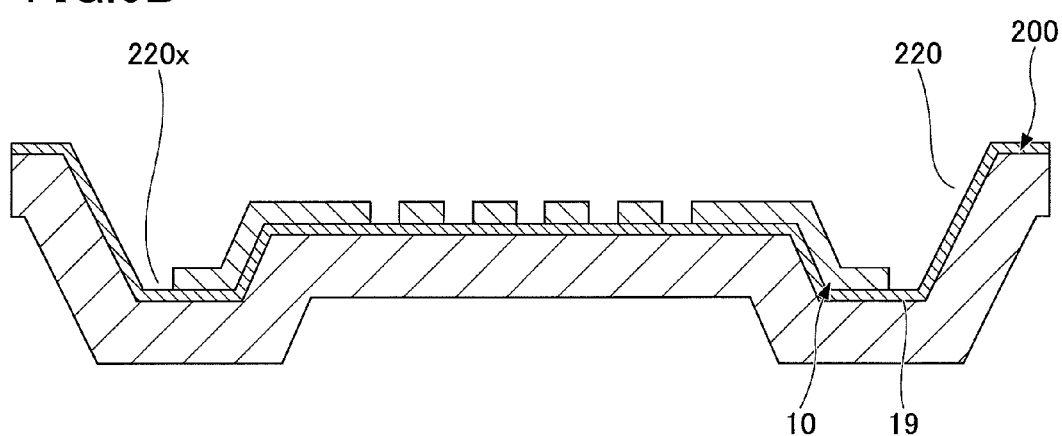

In the process step illustrated in FIG. 6B, the seed layer 19 serves as a power feed layer to selectively form the plated interconnect layer 10 on the seed layer 19. Specifically, a resist pattern having openings corresponding to the plated interconnect layer 10 is first formed on the seed layer 19. The plated interconnect layer 10 made of copper (Cu) or the like is formed in the openings of the resist pattern by electrolytic plating or the like utilizing the seed layer 19 as a power feed layer.

Figure 6C:
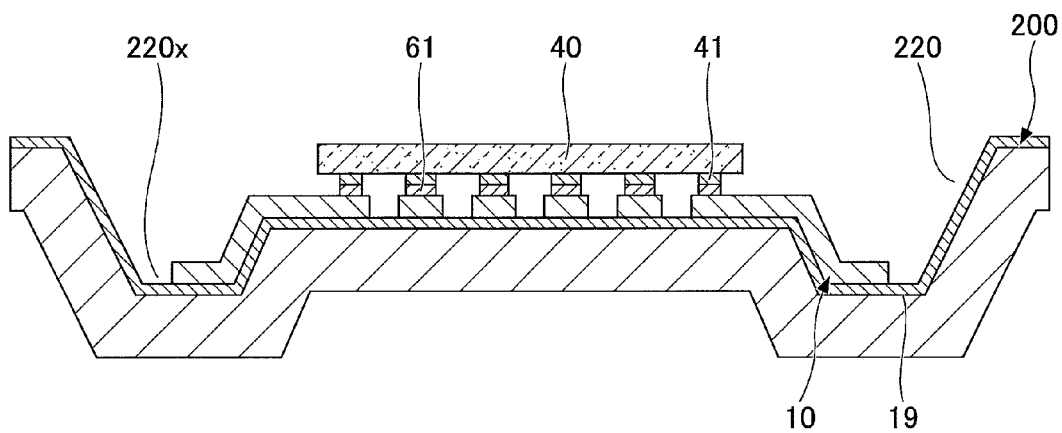

In the process step illustrated in FIG. 6C, the semiconductor chip 40 is mounted through the joint parts 61 to the first face of the plated interconnect layer 10 (i.e., pads 11) formed on the bottom surface of the second recess 220, similarly to the process step illustrated in FIG. 4B. In the process step illustrated in FIG. 7A, the underfill resin 71 for covering the joint parts 61 is disposed between the semiconductor chip 40 and the plated interconnect layer 10, similarly to the process step illustrated in FIG. 4C. The first resin part 81 is then formed that fills the second recess 220 and that has the upper surface reaching the inner side faces of the first recess 210.

Figure 7A:
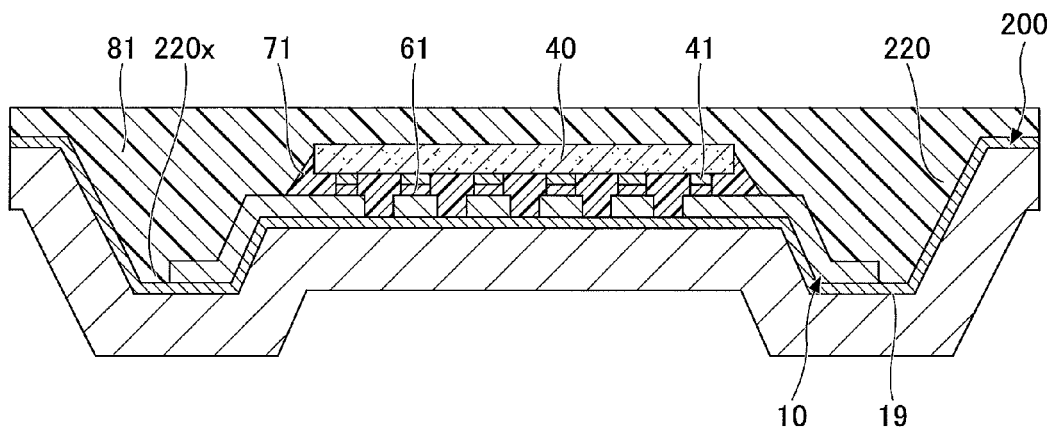
FIGS. 7A through 7C are drawings illustrating an example of process steps for making the semiconductor device according to the first variation of the first embodiment.
Figure 7B:
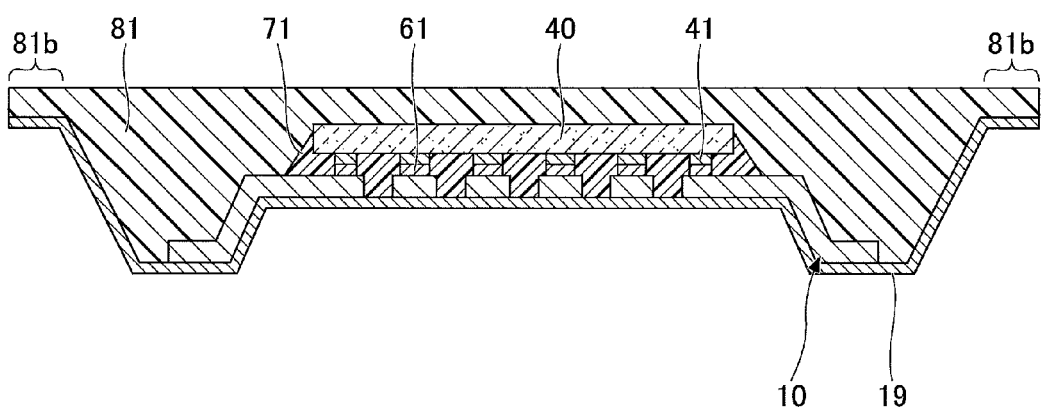

In the process step illustrated in FIG. 7B, the metal plate 200 is removed similarly to the process step illustrated in FIG. 5A. In the process step illustrated in FIG. 7C, the seed layer 19 is removed. In the case of the barrier layer being made of titanium and the seed layer 19 being made of copper, wet etching may remove titanium with hydrofluoric acid or the like, and may remove copper with sulfuric acid and hydrogen peroxide mixture. The removal of the metal plate 200 and the seed layer 19 results in a third recess 230 being formed, which is situated on the lower side of the first resin part 81. The second surface of the plated interconnect layer 10 is exposed in the third recess 230. The inner walls of the third recess 230 are formed of the first resin part 81, the plated interconnect layer 10 and the underfill resin 71.

Figure 7C:
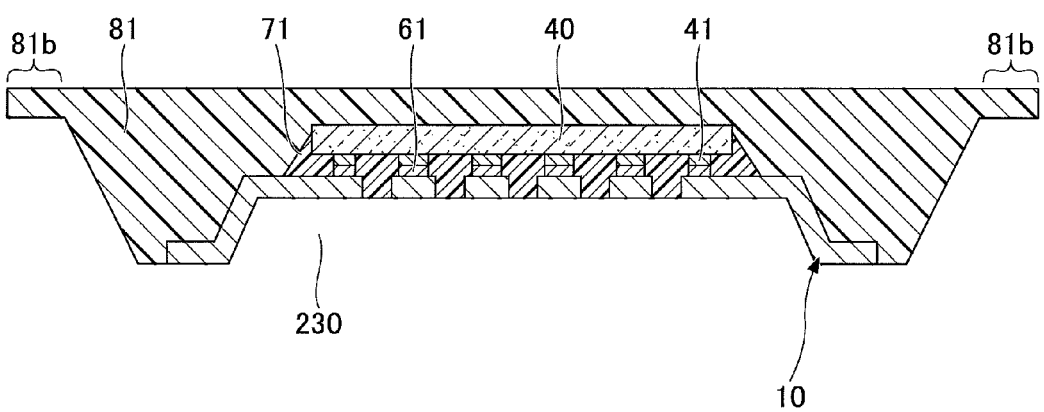

After the process step illustrated in FIG. 7C, the process steps of the first embodiment illustrated in FIG. 5B and FIG. 5C are performed. Further, the structure illustrated in FIG. 5C is cut at the positions indicated by the chain lines D to remove the connecting parts 81b, thereby producing a plurality of semiconductor device 1 illustrated in FIG. 1. It may be noted that a process step of making solder balls or the like on the lower faces of the external connection terminals 12 may be performed after the process step illustrated in FIG. 7C.

Further, the process step illustrated in FIGS. 3A and 3B may be performed after the process steps illustrated in FIG. 6A and FIG. 6B. Namely, the seed layer 19 and the plated interconnect layer 10 may be formed on the metal plate 200 that has yet to be pressed, and, then, the metal plate 200 having the seed layer 19 and the plated interconnect layer 10 formed thereon may be pressed into the shape illustrated in FIGS. 3A and 3B. In this case, the thickness of the plated interconnect layer 10 may properly be determined to ensure that the plated interconnect layer 10 is not broken or disconnected at the time of press working.

In the first variation of the first embodiment described above, the seed layer 19 is formed on the metal plate 200 during the process steps of making the semiconductor device 1. This ensures that the individual parts of the plated interconnect layer 10 are connected together by the seed layer 19 until the seed layer 19 is removed, thereby reducing the likelihood of the plated interconnect layer 10 detaching from the metal plate 200 even when the individual parts of the plated interconnect layer 10 are minute. The provision of the barrier layer under the seed layer 19 serves to reduce the risk of causing mutual diffusion between the seed layer 19 and the metal plate 200 during the process steps involving the application of heat. Other advantages are the same as or similar to those of the first embodiment.

Second Variation of First Embodiment

The second variation of the first embodiment is directed to an example of a semiconductor device in which part of a semiconductor chip is exposed from a resin part. In connection with the second variation of the first embodiment, a description of the same or similar constituent elements as those of the previously provided descriptions may be omitted as appropriate.

Figure 8:
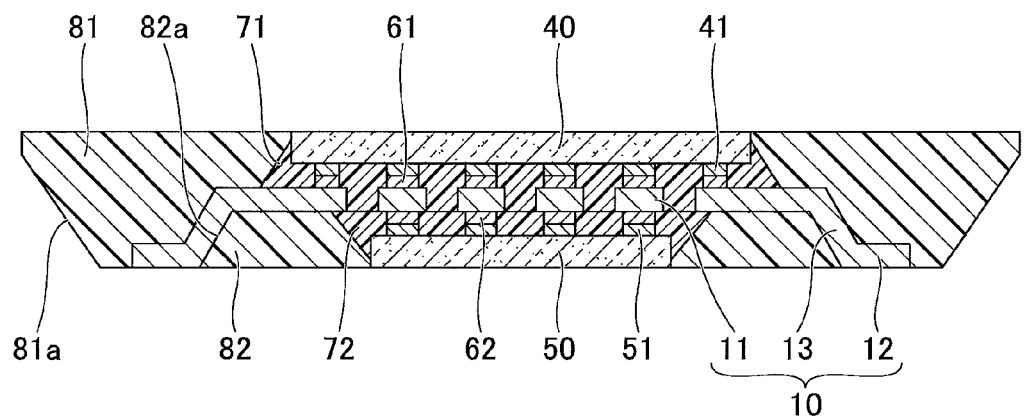
FIG. 8 is a cross-sectional view illustrating an example of a semiconductor device according to a second variation of the first embodiment.

FIG. 8 is a cross-sectional view illustrating an example of a semiconductor device according to the second variation of the first embodiment. In FIG. 8, a semiconductor device 1A according to the second variation of the first embodiment differs from the semiconductor device 1 (see FIG. 1) in that the upper surface of the semiconductor chip 40 is exposed from the first resin part 81, and in that the lower surface of the semiconductor chip 50 is exposed from the second resin part 82. The upper surface of the semiconductor chip 40 may be flush with the upper surface of the first resin part 81. The lower surface of the semiconductor chip 50 may be flush with the lower surface of the second resin part 82.

The structure illustrated in FIG. 8 enables further thinning of the semiconductor device 1A than in the case of the semiconductor device 1, and also enables the improvement of heat dissipation characteristics of the semiconductor chips 40 and 50. The structure may alternatively be such that only one of the upper surface of the semiconductor chip 40 and the lower surface of the semiconductor chip 50 is exposed from the resin part. Other advantages are the same as or similar to those of the first embodiment.

Second Embodiment

The second embodiment is directed to an example of the semiconductor device that has heat sink plates. In connection with the second embodiment, a description of the same or similar constituent elements as those of the previously provided descriptions may be omitted as appropriate.

Figure 9:
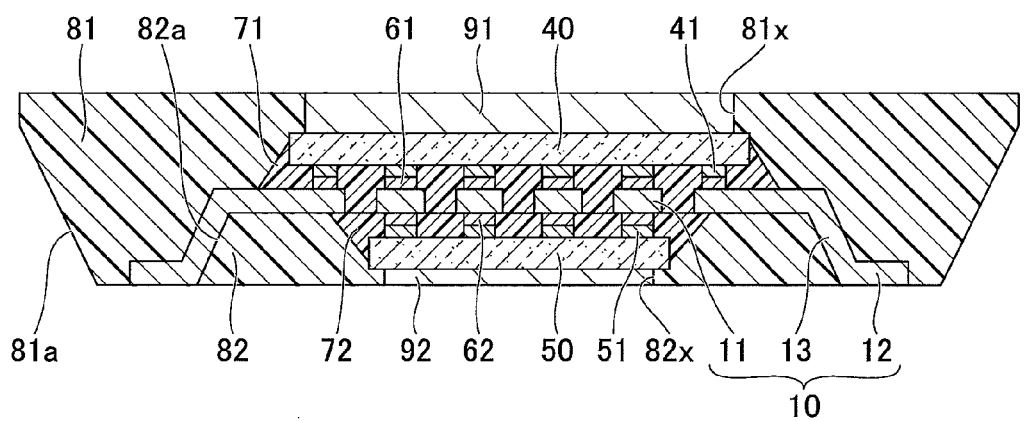
FIG. 9 is a cross-sectional view illustrating an example of a semiconductor device according to the second embodiment.

FIG. 9 is a cross-sectional view illustrating an example of a semiconductor device according to the second embodiment. In FIG. 9, a semiconductor device 2 of the second embodiment differs from the semiconductor device 1 (see FIGS. 1A and 1B) in that heat sink plates 91 and 92 are provided.

The first resin part 81 of the semiconductor device 2 has an opening 81x that exposes the upper surface of the semiconductor chip 40 except for the perimeter thereof. The heat sink plate 91 is disposed on the upper surface of the semiconductor chip 40 that is exposed by the opening 81x. The upper surface of the heat sink plate 91 is exposed from the first resin part 81, and may be flush with the upper surface of the first resin part 81.

The second resin part 82 has an opening 82x that exposes the lower surface of the semiconductor chip 50 except for the perimeter thereof. The heat sink plate 92 is disposed on the lower surface of the semiconductor chip 50 that is exposed by the opening 82x. The lower surface of the heat sink plate 92 is exposed from the second resin part 82, and may be flush with the lower surface of the second resin part 82. The material of the heat sink plates 91 and 92 may be copper, aluminum or the like, for example.

Figure 10A:
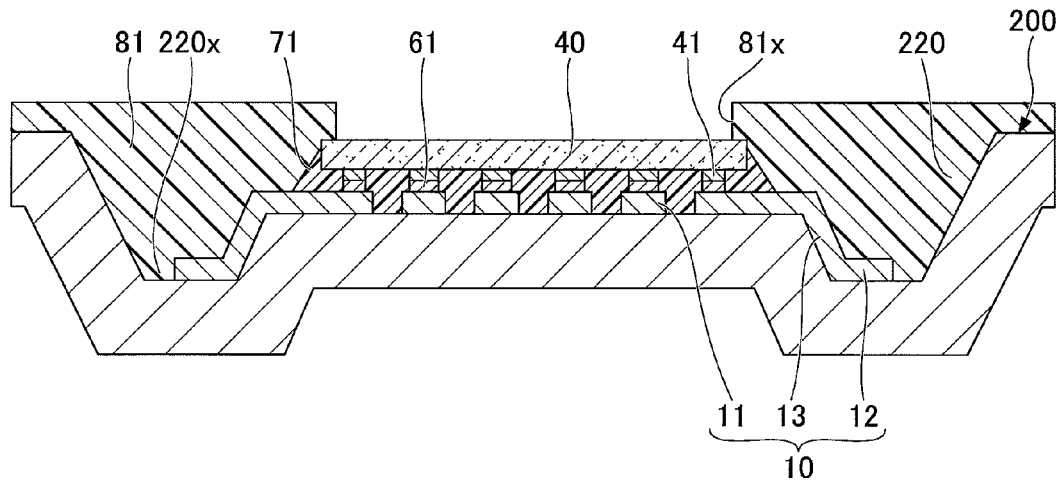
FIGS. 10A through 10O are drawings illustrating an example of process steps for making a semiconductor device according to the second embodiment.

In the process of making the semiconductor device 2, the process steps illustrated in FIGS. 3A and 3B and FIGS. 4A through 4C of the first embodiment are first performed. In the following process step illustrated in FIG. 10A, the underfill resin 71 for covering the joint parts 61 is disposed between the semiconductor chip 40 and the plated interconnect layer 10, similarly to the process step illustrated in FIG. 4C. The first resin part 81 is then formed that fills the second recess 220 and that has the upper surface reaching the inner side faces of the first recess 210. In this embodiment, however, a metal mold for use in transfer molding or the like is used to prevent the resin from flowing over to a certain area of the upper surface of the semiconductor chip 40, thereby making the opening 81x in the first resin part 81 to expose the certain area of the upper surface of the semiconductor chip 40. The opening 81x may be formed to expose a center area other than the perimeter of the upper surface of the semiconductor chip 40.

Figure 10B:
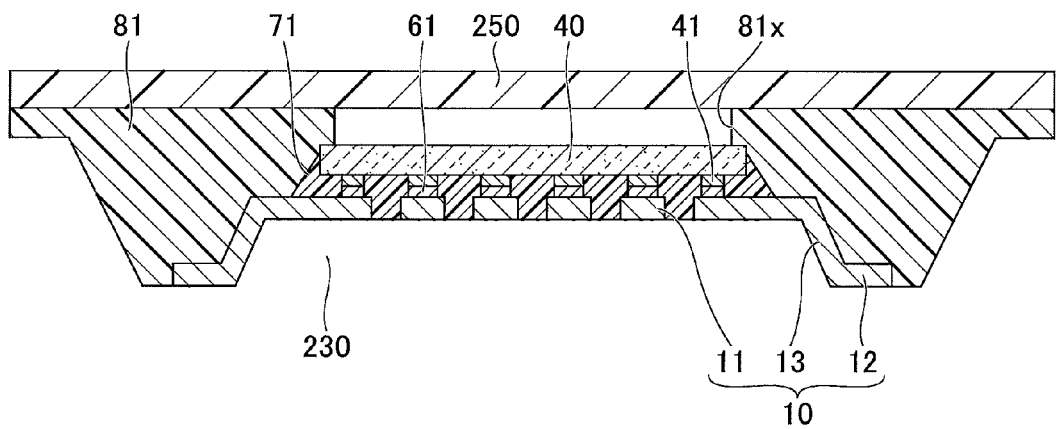
Figure 10C:
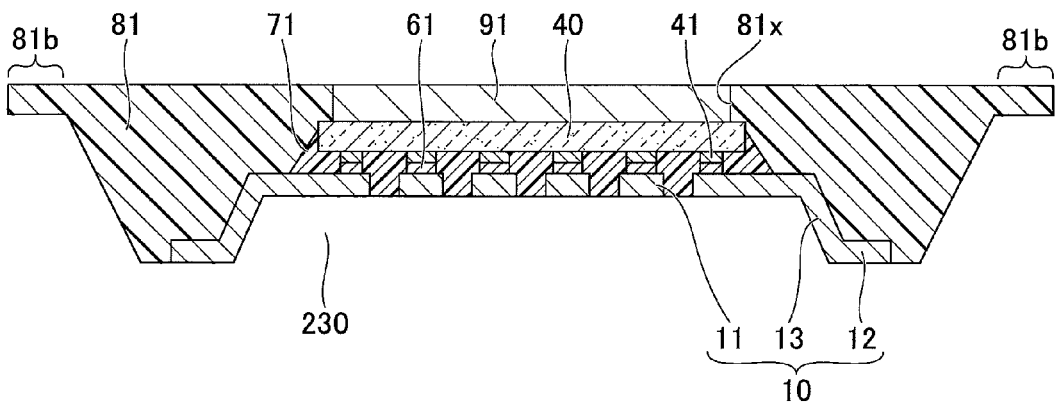

In the process step illustrated in FIG. 10B, a protective tape 250 for sealing the opening 81x is attached to the upper surface of the first resin part 81 to protect the semiconductor chip 40. The metal plate 200 is then removed similarly to the process step illustrated in FIG. 5A. The removal of the metal plate 200 results in a third recess 230 being formed, which is situated on the lower side of the first resin part 81. The second surface of the plated interconnect layer 10 is exposed in the third recess 230.

Figure 11A:
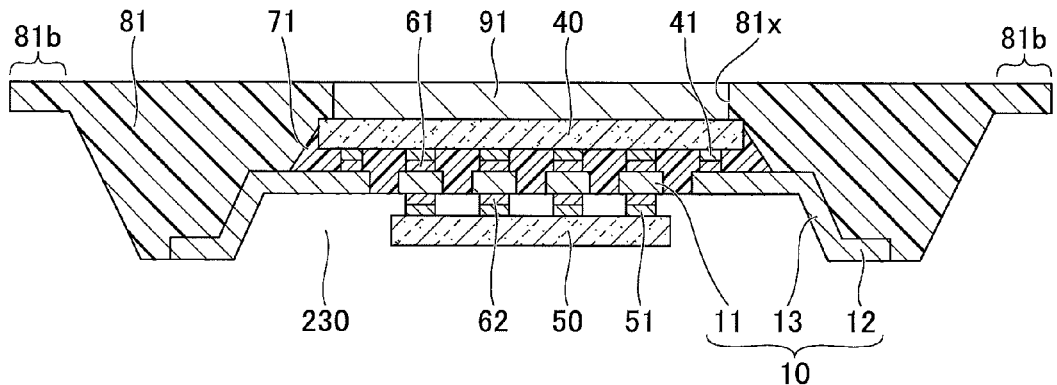
FIGS. 11A through 11C are drawings illustrating an example of process steps for making the semiconductor device according to the second embodiment.

In the process step illustrated in FIG. 100, the heat sink plate 91 is attached to the upper surface of the semiconductor chip 40 exposed through the opening 81x. The upper surface of the heat sink plate 91 may be flush with the upper surface of the first resin part 81. In the process step illustrated in FIG. 11A, the semiconductor chip 50 is mounted to the second face of the plated interconnect layer 10 (i.e., pads 11) through the joint parts 62, similarly to the process step illustrated in FIG. 5B.

Figure 11B:
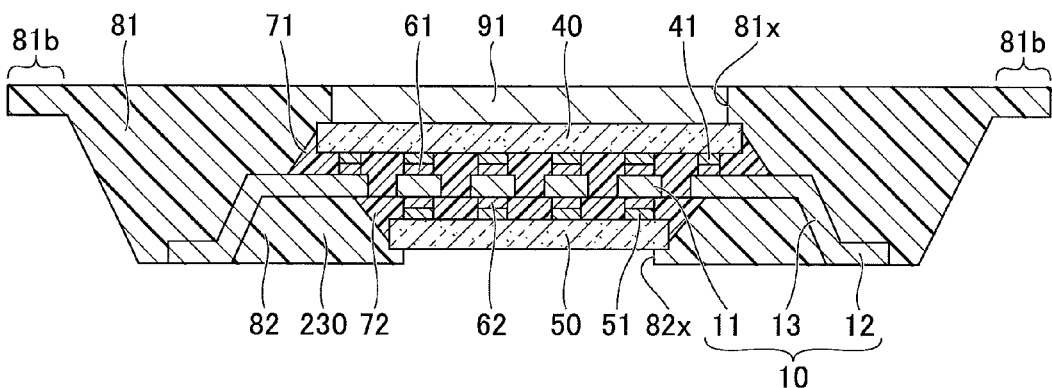

In the process step illustrated in FIG. 11B, the underfill resin 72 and the second resin part 82 are formed similarly to the process step illustrated in FIG. 50. In this embodiment, however, a metal mold for use in transfer molding or the like is used to prevent the resin from flowing over to a certain area of the lower surface of the semiconductor chip 50, thereby making the opening 82x in the second resin part 82 to expose the certain area of the lower surface of the semiconductor chip 50. The opening 82x may be formed to expose a center area other than the perimeter of the lower surface of the semiconductor chip 50.

Figure 11C:
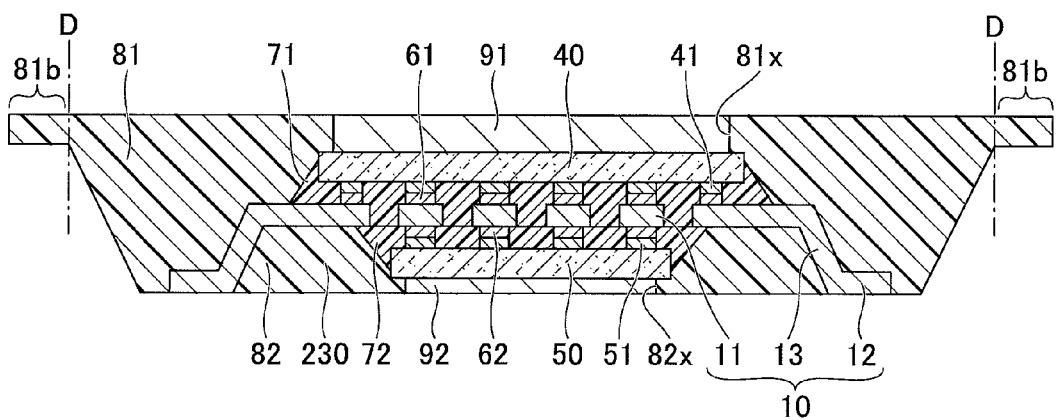

In the process step illustrated in FIG. 11C, the heat sink plate 92 is attached to the lower surface of the semiconductor chip 50 exposed through the opening 82x. The lower surface of the heat sink plate 92 may be flush with the lower surface of the second resin part 82. After the process step illustrated in FIG. 11C, the structure illustrated in FIG. 11C is cut at the positions indicated by chain lines D to remove the connecting parts 81b, resulting in a plurality of semiconductor devices 2 of FIG. 9 being produced.

In the secondary embodiment as described, the provision of the heat sink plates 91 and 92 in the semiconductor device 2 serves to improve heat dissipation characteristics when the semiconductor chips 40 and 50 generate heat during operation. Other advantages are the same as or similar to those of the first embodiment.

The structure may alternatively be such that only one of the upper surface of the semiconductor chip 40 and the lower surface of the semiconductor chip 50 has a heat sink plate attached thereto. The opening 81x may be formed such as to expose the entire upper surface of the semiconductor chip 40, with the use of a heat sink plate 91 that is larger than the semiconductor chip 40. Similarly, the opening 82x may be formed such as to expose the entire lower surface of the semiconductor chip 50, with the use of a heat sink plate 92 that is larger than the semiconductor chip 50.

Third Embodiment

The third embodiment is directed to an example of the semiconductor device that has an insulating layer around the interconnect layer. In connection with the third embodiment, a description of the same or similar constituent elements as those of the previously provided descriptions may be omitted as appropriate.

Figure 12:
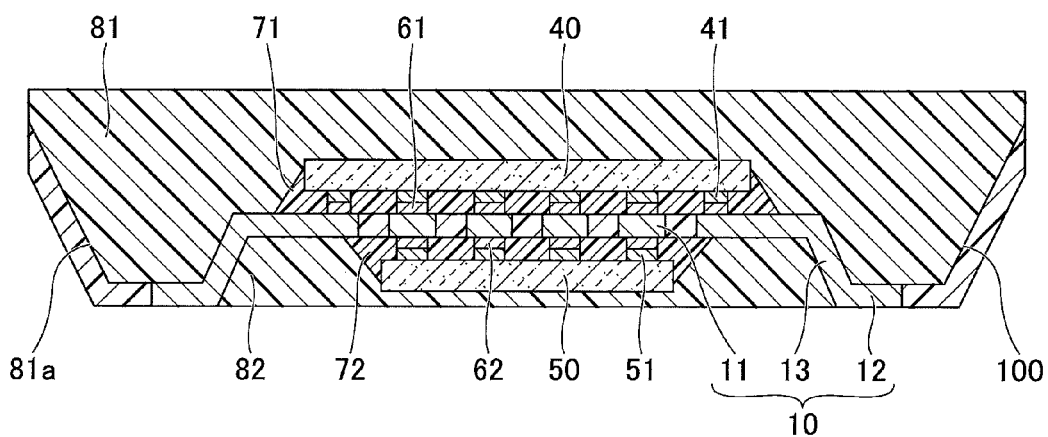
FIG. 12 is a cross-sectional view illustrating an example of a semiconductor device according to the third embodiment.

FIG. 12 is a cross-sectional view illustrating an example of a semiconductor device according to the third embodiment. In FIG. 12, a semiconductor device 3 of the third embodiment differs from the semiconductor device 1 (see FIGS. 1A and 1B) in that an insulating layer 100 is provided.

The semiconductor device 3 has the insulating layer 100 having an opening that exposes an area in which the plated interconnect layer 10 is formed. The plated interconnect layer 10 is formed in such a manner as to fill the opening of the insulating layer 100. In other words, the insulating layer 100 is formed in such a manner as to fill the surrounding area around the plated interconnect layer 10. The plated interconnect layer 10 and the insulating layer 100 may have approximately the same thickness. In this case, the upper surface of the plated interconnect layer 10 and the upper surface of the insulating layer 100 constitute one continuous surface. The insulating layer 100 is also formed on the surfaces of the tapered portions 81a of the first resin part 81. The material of the insulating layer 100 may be a photosensitive resin (e.g., epoxy-based resin or phenol-based resin).

Figure 13A:
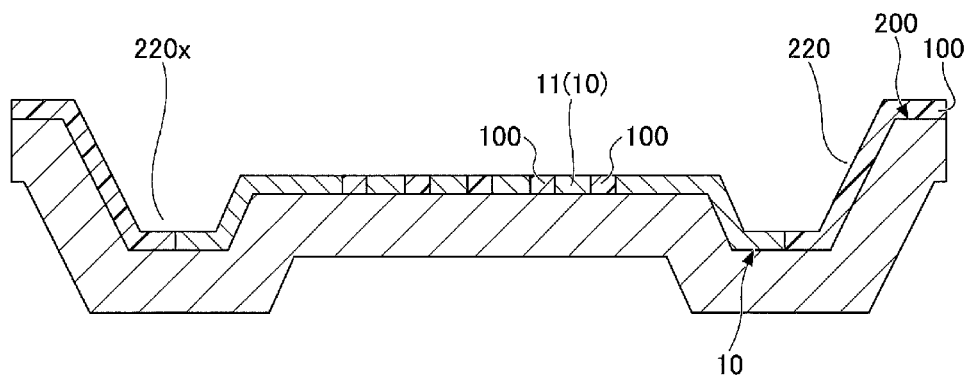
FIGS. 13A through 13C are drawings illustrating an example of process steps for making a semiconductor device according to the third embodiment.

In making the semiconductor device 3, the process step of the first embodiment illustrated in FIGS. 3A and 3B is first performed. In the following process step illustrated in FIG. 13A, the insulating layer 100 and the plated interconnect layer 10 are formed in the second recess 220. Specifically, the insulating layer 100 is patterned by photolithography, for example, to make an opening that exposes the surface of the metal plate 200. The plated interconnect layer 10 made of copper (Cu) or the like is formed in the opening of the insulating layer 100 by electrolytic plating or the like utilizing the metal plate 200 as a power feed layer. The provision of the plated interconnect layer 10 and the insulating layer 100 having approximately the same thickness achieves a single continuous surface formed by the upper surface of the plated interconnect layer 10 and the upper surface of the insulating layer 100.

Figure 13B:
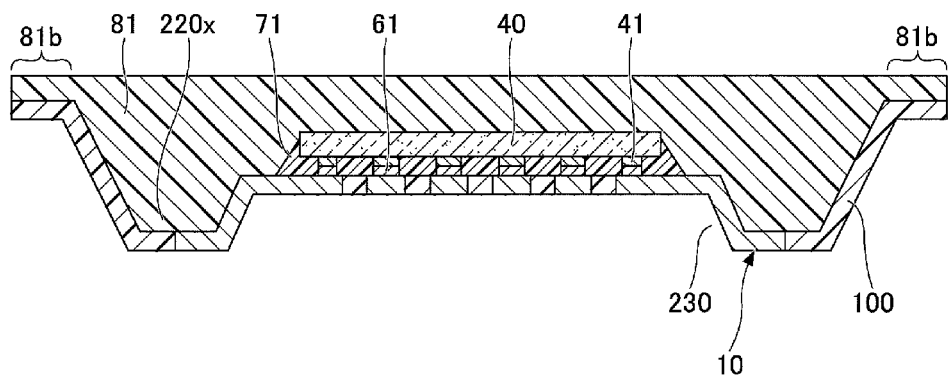

In the process step illustrated in FIG. 13B, the semiconductor chip 40 is mounted to the upper faces of the pads 11 of the plated interconnect layer 10 via the joint parts 61, similarly to the process step illustrated in FIG. 4B. In the process step illustrated in FIG. 4C, the underfill resin 71 for covering the joint parts 61 is disposed between the semiconductor chip 40 and the plated interconnect layer 10, followed by forming the first resin part 81 that fills the second recess 220 and that has an upper face reaching the inner side faces of the first recess 210. The metal plate 200 is then removed similarly to the process step illustrated in FIG. 5A, thereby forming the third recess 230. The inner wall faces of the third recess 230 are constituted by the plated interconnect layer 10 and the insulating layer 100.

Figure 13C:
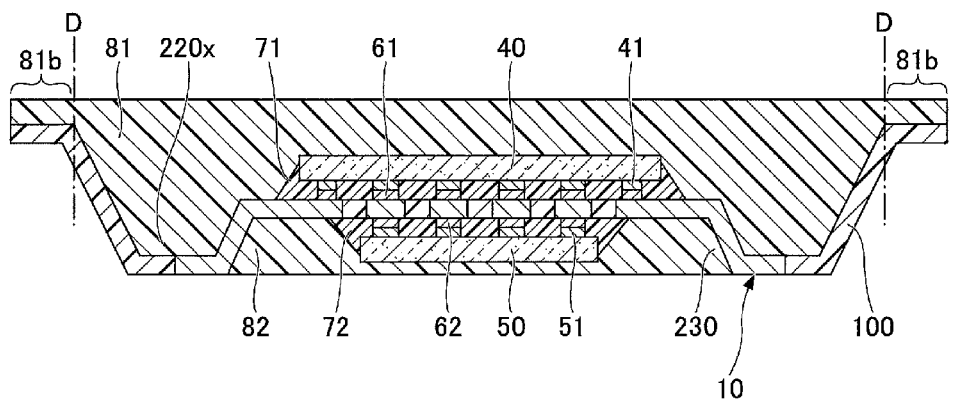

In the process step illustrated in FIG. 13C, the semiconductor chip 50 is mounted to the lower faces of the pads 11 of the plated interconnect layer 10 via the joint parts 62, similarly to the process step illustrated in FIG. 5B. The underfill resin 72 for covering the joint parts 62 is disposed between the semiconductor chip 50 and the plated interconnect layer 10, similarly to the process step illustrated in FIG. 5C. The second resin part 82 then fills the third recess 230 to cover the semiconductor chip 50 and the underfill resin 72.

After the process step illustrated in FIG. 13C, the structure illustrated in FIG. 13C is cut at the positions indicated by chain lines D to remove the connecting parts 81b, resulting in a plurality of semiconductor devices 3 of FIG. 12 being produced. The insulating layer 100 formed at the lower faces of the connecting parts 81b is also removed together with the connecting parts 81b.

In the third embodiment described above, the process steps of making the semiconductor device 3 include forming the insulating layer 100 having the opening that exposes the area in which the plated interconnect layer 10 is to be formed, and also include forming the plated interconnect layer 10 having the same thickness as the insulating layer 100 to fill the opening of the insulating layer 100. This arrangement reduces the likelihood of the solder material of the joint parts 61 flowing from the pads 11 at the time of mounting the semiconductor chip 40. Similarly, this arrangement reduces the likelihood of the solder material of the joint parts 62 flowing from the pads 11 at the time of mounting the semiconductor chip 50. Further, this arrangement improves the flow of resin for forming the underfill resins 71 and 72. Other advantages are the same as or similar to those of the first embodiment.

Fourth Embodiment

The fourth embodiment is directed to an example in which the resin parts are made of elastic resin. In connection with the fourth embodiment, a description of the same or similar constituent elements as those of the previously provided descriptions may be omitted as appropriate.

Figure 14:
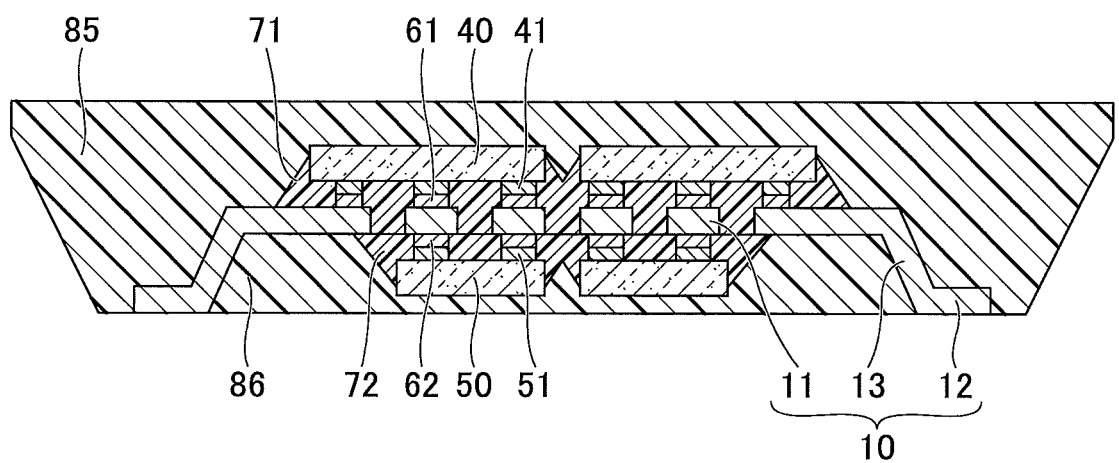
FIG. 14 is a cross-sectional view illustrating an example of a semiconductor device according to the fourth embodiment.

FIG. 14 is a cross-sectional view illustrating an example of a semiconductor device according to the fourth embodiment. A semiconductor device 4 of the fourth embodiment illustrated in FIG. 14 differs from the semiconductor device 1 (see FIGS. 1A and 1B) in that the first resin part 81 and the second resin part 82 are replaced with a first resin part 85 and a second resin part 86, respectively. The first resin part 85 and the second resin part 86 may be made of elastic resin (i.e., elastomer) such as silicone resin. In the semiconductor device 4, further, a plurality of semiconductor chips 40 are mounted to the upper face of the plated interconnect layer 10, and a plurality of semiconductor chips 50 are mounted to the lower face of the plated interconnect layer 10.

In order to make the semiconductor device 4, the first resin part 85 made of elastic resin such as silicone resin is formed in place of the first resin part 81 in the process step of the first embodiment illustrated in FIG. 4C. In the process step illustrated in FIG. 5C, the second resin part 86 made of elastic resin such as silicone resin is formed in place of the second resin part 82. The first resin part 85 and the second resin part 86 may be formed by potting.

In the fourth embodiment described above, elastic resin such as silicone resin is used for the first resin part 85 and the second resin part 86, which enables the provision of the semiconductor device 4 having elasticity in parts other than the semiconductor chips 40 and 50. Consequently, the semiconductor device 4 may be applicable to a wearable device or the like. Especially, the configuration having a plurality of semiconductor chips disposed on both sides of the plated interconnect layer 10 serves to increase the area sizes of flexible areas having elasticity, and, thus, is further suitable for application to a wearable device or the like. Other advantages are the same as or similar to those of the first embodiment.

According to at least one embodiment, a semiconductor device is provided that has a plurality electronic components arranged in the thickness direction thereof and that is produced by simple production steps.

Further, the present invention is not limited to these embodiments, but various variations and modifications may be made without departing from the scope of the present invention.

For example, one of the semiconductor chip 40 and the semiconductor chip 50 may be a passive component rather than a semiconductor chip. Further, a plurality of semiconductor chips may be mounted to the first face of the plated interconnect layer 10, and a plurality of semiconductor chips may be mounted to the second side of the plated interconnect layer 10. On either side of the plated interconnect layer 10, one or more semiconductor chip and one or more passive components may coexist in a mixed arrangement.

Moreover, a release layer may be formed on the surface of the metal plate 200 in advance, and the plated interconnect layer 10 or the like may be formed on the metal plate 200 with the release layer intervening therebetween. The metal plate 200 may then be removed mechanically, rather than by etching. In such a case, a silicone-based or fluorine-based parting agent may be used as the release layer.

The disclosures herein include the following clauses.

Clause 1. A method of making a semiconductor device, comprising: processing a metal plate to form a first recess therein, to form a plurality of second recesses in a bottom surface of the first recess, and to form a circumferential recess at a perimeter of a bottom surface of each of the second recesses; forming a single-layered plated interconnect layer extending from the bottom surface of each of the second recesses to a bottom surface of the circumferential recess; mounting a first electronic component to an upper face of the plated interconnect layer at a position of the bottom surface of the second recess; forming a first resin part covering the first electronic component and situated on an upper side of the plated interconnect layer, the first resin part filling the first recess including the second recesses; removing the metal plate to form third recesses at a lower surface of the first resin part so as to expose a lower face of the plated interconnect layer in the third recesses; mounting a second electronic component to the lower face of the plated interconnect layer in each of the third recesses; and forming a second resin part covering the second electronic component and situated on a lower side of the plated interconnect layer, the second resin part filling each of the third recesses, wherein at least one of the first electronic component and the second electronic component is a semiconductor chip, and at least part of the first electronic component and at least part of the second electronic component face each other across the plated interconnect layer, wherein the plated interconnect layer includes a sloping portion sloping downward toward a periphery of the plated interconnect layer, wherein an end part of the sloping portion is bent to have a face of the end part exposed from the first resin part and the second resin part.

Clause 2. The method as claimed in clause 1, wherein the step of forming the plated interconnect layer includes: forming a seed layer extending from the bottom surface of each of the second recesses to the bottom surface of the circumferential recess; selectively forming the plated interconnect layer on the seed layer by use of the seed layer as a power feed layer; and removing the seed layer after removing the metal plate.

Clause 3. The method as claimed in clause 1, wherein the step of forming the plated interconnect layer includes: forming an insulating layer having an opening that exposes an area in which the plated interconnect layer is to be formed in each of the second recesses; and forming the plated interconnect layer that fills the opening.

Clause 4. The method as claimed in clause 1, wherein the first resin part formed in one of the second recesses and the first resin part formed in an adjacent one of the second recesses is connected through a connecting part after removal of the metal plate, and the connecting part is removed after forming the second resin part to form a plurality of semiconductor devices.

What is claimed is:

1. A semiconductor device, comprising:
a single-layered plated interconnect layer;
a first electronic component mounted to an upper face of the plated interconnect layer, the first electronic component having a first pad disposed on a lower face of the first electronic component;
a second electronic component mounted to a lower face of the plated interconnect layer, the second electronic component having a second pad disposed on an upper face of the second electronic component;
a first resin part covering the first electronic component and situated on an upper side of the plated interconnect layer; and
a second resin part covering the second electronic component and situated on a lower side of the plated interconnect layer,
wherein at least one of the first electronic component and the second electronic component is a semiconductor chip, and at least part of the first electronic component and at least part of the second electronic component face each other across the plated interconnect layer,
wherein the plated interconnect layer includes a sloping portion disposed on a sloping boundary between the first resin part and the second resin part, the sloping portion sloping downward toward a periphery of the plated interconnect layer,
wherein an end part of the sloping portion is bent to have a face of the end part exposed from the second resin part, and a lower surface of the second resin part is flush with the face of the end part,
wherein the lower face of the first electronic component having the first pad disposed thereon faces, across a portion of the plated interconnect layer, the upper face of the second electronic component having the second pad disposed thereon, and the portion of the plated interconnect layer includes a first interconnect pad, the first interconnect pad providing an electrical connection between the first pad of the first electronic component and the second pad of the second electronic component,
wherein the plated interconnect layer further includes:
an interconnection having the sloping portion; and
a second interconnect pad connected to the interconnection and situated on a same plane as the first interconnect pad, the second interconnect pad being electrically connected to the first electronic component or to the second electronic component, and
wherein the first interconnect pad of the plated interconnect layer has no electrical connection extending outwardly beyond perimeters of the first electronic component and the second electronic component in a plan view, and is electrically connected neither to the second interconnect pad nor to the interconnection via the plated interconnect layer, and the first interconnect pad, the second interconnect pad, and the interconnection are made of a same material.

2. The semiconductor device as claimed in claim 1, further comprising an insulating layer disposed between the first resin part and the second resin part, the first interconnect pad having lateral faces thereof that are covered with the insulating layer.

3. The semiconductor device as claimed in claim 1, further comprising a heat sink plate situated on at least one of an upper surface of the first electronic component and a lower surface of the second electronic component, and wherein part of the heat sink plate is exposed from the first resin part or the second resin part.

4. The semiconductor device as claimed in claim 1, wherein the first resin part and the second resin part is made of elastic resin.

5. The semiconductor device as claimed in claim 1, wherein a thickness of the plated interconnect layer is greater than or equal to 1 micrometer and smaller than or equal to 35 micrometers.

6. The semiconductor device as claimed in claim 1, wherein the portion of the plated interconnect layer includes a plurality of first interconnect pads one of which is said first interconnect pad, the first interconnect pads being arranged in a matrix.

* * * * *